(12) United States Patent
Higashitani (10) Patent No.: US 7,968,803 B2
(45) Date of Patent: Jun. 28, 2011

(54) WIRING SUBSTRATE, WIRING MATERIAL, COPPER-CLAD LAMINATE, AND METHOD OF MANUFACTURING THE WIRING SUBSTRATE

(75) Inventor: Hideki Higashitani, Osaka (JP)

(73) Assignee: Panasonic Corporation, Osaka (JP)

( * ) Notice: Subject to any disclaimer, the term of this patent is extended or adjusted under 35 U.S.C. 154(b) by 708 days.

(21) Appl. No.: 11/658,877

(22) PCT Filed: Jul. 7, 2006

(86) PCT No.: PCT/JP2006/313559
§ 371 (c)(1),
(2), (4) Date: Jan. 30, 2007

(87) PCT Pub. No.: WO2007/010758
PCT Pub. Date: Jan. 25, 2007

(65) Prior Publication Data
US 2010/0032202 A1 Feb. 11, 2010

(30) Foreign Application Priority Data

Jul. 15, 2005 (JP) ................. 2005-206426
Jul. 15, 2005 (JP) ................. 2005-206427
Jul. 15, 2005 (JP) ................. 2005-206428

(51) Int. Cl.
*H05K 1/11* (2006.01)
(52) U.S. Cl. ............. 174/264; 174/261; 174/262

(58) Field of Classification Search .......... 174/261–266
See application file for complete search history.

(56) References Cited

U.S. PATENT DOCUMENTS

| | | | | |
|---|---|---|---|---|
| 5,689,879 A * | 11/1997 | Urasaki et al. | ................. | 29/846 |
| 6,827,867 B2 * | 12/2004 | Yamamoto et al. | ............. | 216/13 |
| 6,889,433 B1 * | 5/2005 | Enomoto et al. | ................. | 29/852 |
| 6,924,043 B2 * | 8/2005 | Suzuki et al. | ................. | 428/615 |

FOREIGN PATENT DOCUMENTS

| | | |
|---|---|---|
| JP | 6-268345 | 9/1994 |
| JP | 2000-068620 | 3/2000 |
| JP | 2001-102754 | 4/2001 |
| JP | 2005-101398 | 4/2005 |

OTHER PUBLICATIONS

Partial translation of JP 2005-101398, (Apr. 4, 2005).
Partial translation of JP 2001-102754, (Apr. 13, 2001).

* cited by examiner

*Primary Examiner* — Ishwarbhai B Patel
(74) *Attorney, Agent, or Firm* — Wenderoth, Lind & Ponack, LLP.

(57) ABSTRACT

A wiring substrate of the invention comprises an electrical insulation substrate (1), a through-hole (3) formed in the electrical insulation substrate, electrically conductive paste (4) filled inside the through-hole, and wiring traces (11) formed on one or both surfaces of the electrical insulation substrate and electrically connected with the electrically conductive paste, wherein interfaces of the wiring traces in contact with the electrically conductive paste have at least one of an asperate surface and a smooth surface, and a plurality of granular bumps (14) formed further thereon.

13 Claims, 7 Drawing Sheets

WIRING SUBSTRATE, WIRING MATERIAL, COPPER-CLAD LAMINATE, AND METHOD OF MANUFACTURING THE WIRING SUBSTRATE

This application is a U.S. national phase application of PCT International Application PCT/JP2006/313559, filed Jul. 7, 2006.

TECHNICAL FIELD

The present invention relates to a double-sided or multi-layer wiring substrate provided with a plurality of layers having wiring traces connected electrically through inner via-holes. The invention also relates to a method of manufacturing the wiring substrate.

BACKGROUND ART

There is a strong demand for supply at low prices of multilayer wiring substrates suitable for high-density mounting of semiconductor chips such as LSI's for use in not only industrial applications but also the wide field of consumer-oriented products, as with the recent trend of downsizing and high performance of electronic products. It is important for a multilayer wiring substrate of such kind to provide highly reliable electrical connections among wiring traces formed with fine pitches on a plurality of layers.

In the field of semiconductor interposers using many high-density wiring substrates, there is a substantial increase in number of connecting terminals of semiconductors due to the increase of signal and grounding terminals proportionate to the multifunctional trend of semiconductors. Since fine-pitch mounting of semiconductors is advancing continuously due to the need of mounting such semiconductors into packages of the conventional size, the requirement continues to exist for further fining of mounting pitches, especially for semiconductor interposers.

On the other hand, there is also advancement in the area of fine-pitch mounting between mother boards and ball grid arrays (BGA), in which terminal pitches of 0.5 mm or less are now used widely, and it is therefore the current situation that requires measures to deal with pitches as small as 0.25 mm. As the terminal pitches decrease in this manner, it becomes inevitable that land areas for mounting BGA's also decrease. It is therefore necessary to provide wiring traces with a higher bonding strength per unit area in order to ensure the strength of wiring lands.

To fulfill such needs of the market, there exists a technique called an inner viahole connection method capable of making interlayer connections of any electrodes at any positions of wiring traces of multilayer wiring substrates, or multilayer resin substrates of an all-layer IVH structure, in place of the ordinary plated metal conductors on inner walls of through-holes, which has been the main current of interlayer connections of the conventional multilayer wiring substrates. This method can make connections possible among only the desired layers through a conductive material filled in viaholes of the multilayer wiring substrate, and achieve downsizing of the substrate and high-density mounting since it enables formation of the inner viaholes just under component lands. In addition, the method can reduce the stress imposed on inner viaholes, and attain stable electrical connections irrespective of dimensional changes due to thermal shocks, etc. since the electrical connections in the inner viaholes are made with conductive paste.

A multilayer wiring substrate manufactured by taking the steps illustrated in FIG. 8A to FIG. 8I has been proposed in the past as this type of multilayer resin substrate of all layer IVH structure.

Figure 8A:
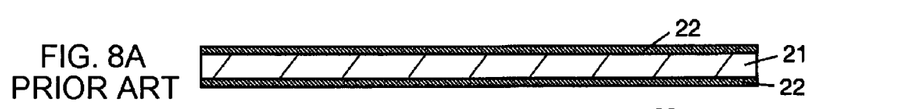
FIG. 8A is a cross sectional view of a conventional wiring substrate illustrating one step of a manufacturing method thereof.
Figure 8B:
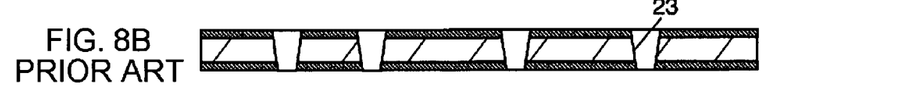
FIG. 8B is a cross sectional view of the conventional wiring substrate illustrating another step of the manufacturing method.
Figure 8C:
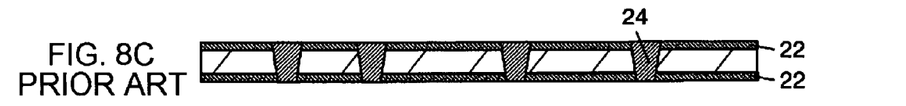
FIG. 8C is a cross sectional view of the conventional wiring substrate illustrating another step of the manufacturing method.
Figure 8D:
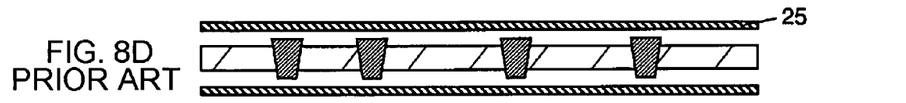
FIG. 8D is a cross sectional view of the conventional wiring substrate illustrating another step of the manufacturing method.

For a start, shown in FIG. 8A is electrical insulation substrate 21, on which protective films 22 are bonded to both surfaces by a laminating process. It is then processed with a laser or the like to form through-holes 23 that penetrate through all of electrical insulation substrate 21 and protective films 22, as shown in FIG. 8B. Next, through-holes 23 are filled with electrically conductive paste 24, which serves as a conductive material, as shown in FIG. 8C. Protective films 22 are removed thereafter from both surfaces, and foil wiring members 25 are laid on both of the surfaces under this condition, to thus prepare the state shown in FIG. 8D.

Figure 8E:
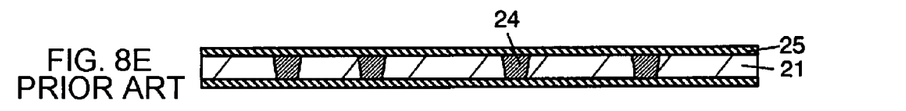
FIG. 8E is a cross sectional view of the conventional wiring substrate illustrating another step of the manufacturing method.

Wiring members 25 are subjected to thermo-compression in the step shown in FIG. 8E to bond them with electrical insulation substrate 21. This process of thermo-compression hardens electrically conductive paste 24, and makes electrical connections between wiring members 25 and electrically conductive paste 24.

Figures 8F, 8G:
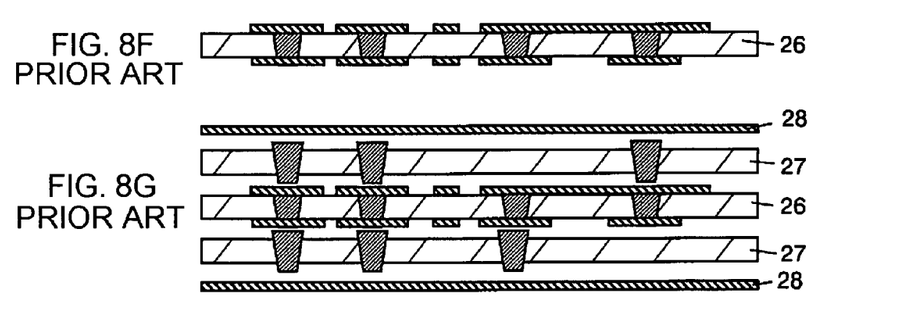
FIG. 8F is a cross sectional view of the conventional wiring substrate illustrating another step of the manufacturing method.
FIG. 8G is a cross sectional view of the conventional wiring substrate illustrating another step of the manufacturing method.

Next, wiring members 25 are patterned by an etching process to complete double-sided wiring substrate 26, as shown in FIG. 8F.

Following the above, electrical insulation substrates 27 having electrically conductive paste filled therein and formed by the same steps as illustrated in FIGS. 8A to 8D are laid together with wiring members 28 on both surfaces of double-sided wiring substrate 26, as shown in FIG. 8G.

Figure 8H:
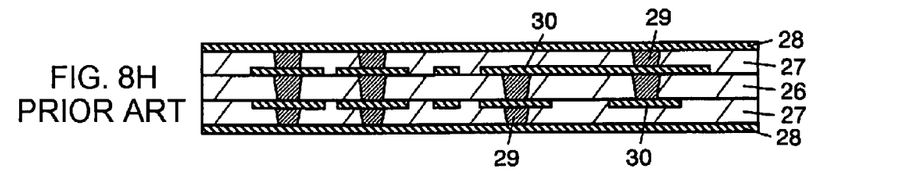
FIG. 8H is a cross sectional view of the conventional wiring substrate illustrating still another step of the manufacturing method.

Subsequently, wiring members 28 are subjected to thermo-compression in the step shown in FIG. 8H to bond them to electrical insulation substrate 27. Double-sided wiring substrate 26 and electrical insulation substrates 27 are also bonded at the same time in this step.

This process of thermo-compression hardens electrically conductive paste 29 in the same manner as in the step shown in FIG. 8E, and makes wiring members 28 and wiring traces 30 on the double-sided wiring substrate come into close contact to complete electrical connections between them.

Figure 8I:
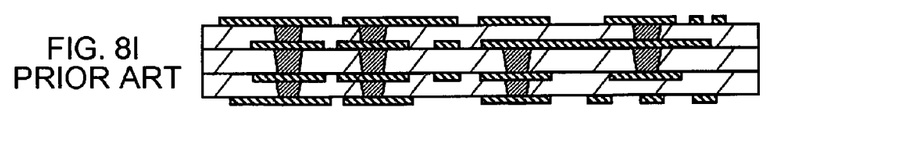
FIG. 8I is a cross sectional view of the conventional wiring substrate illustrating yet another step of the manufacturing method.

Wiring members 28 on the outer layers are patterned next by the etching process to complete the multilayer wiring substrate shown in FIG. 8I. The multilayer wiring substrate shown here is an example of a four-layered substrate. The number of layers of the multilayer wiring substrate is not limited to four; rather, the number of layers can be increased by repeating the same steps. Japanese Patent Unexamined Publication, No. H06-268345 is one example of the prior art documents known to be related to the invention of this application.

Besides the above, Japanese Patent Unexamined Publication, No. 2000-68620 discloses a method of roughening interfaces between wiring members and electrically conductive pastes by abrasive machining such as sandblasting and jet scrubbing, as a technique for improving the electrical continuity via the through-holes in the multilayer wiring substrate.

In the case of patterning the wiring members by etching in the manner as described, it is necessary to control a width of wiring traces highly accurately by setting an etching time to the minimum required to form the fine wiring traces and to reduce excessive thinning of the wiring traces due to over-etching. In other words, it is essential to use a material having a smooth surface for the wiring members in order to reduce an amount of embedment into the electrical insulation substrate, which can result in variations of the etching time.

When the wiring members used have smooth surfaces, however, bonding to the electrical insulation substrate weakens. This gives rise to a problem that a strength of bonding of the wiring traces becomes deficient, thereby causing the wiring traces to come off at portions where mechanical stresses concentrate during mounting.

In addition, reduction in diameters of the through-holes for the purpose of fining wiring pitches inevitably results in decrease of contact areas and thus decrease in the number of electrical contacting points between the wiring traces and the electrically conductive pastes. Resultant contact conditions with conductive particles will have a considerable effect upon their electrical continuities. When surfaces of the wiring members are roughened into a finely and sharply pointed configuration for improvement of the bonding strength of the wiring traces, for instance, their contacting areas with the conductive particles decrease on the contrary, which also gives rise to another problem of degrading the electrical connections.

SUMMARY OF THE INVENTION

A wiring substrate of the present invention comprises an electrical insulation substrate, a through-hole formed in the electrical insulation substrate, an electrically conductive paste filled inside this through-hole, and wiring traces disposed on one or both surfaces of the electrical insulation substrate and electrically connected with the electrically conductive paste, wherein interfaces of the wiring traces in contact with the electrically conductive paste include at least one of an asperate surface and a smooth surface, and a plurality of granular bumps further formed thereon.

The present invention further includes a wiring member used for the wiring substrate, and a copper-clad laminate comprising an electrical insulation substrate laminated with the wiring member.

In addition, the present invention includes a method of manufacturing the wiring substrate of the above structure, and this manufacturing method comprises the following steps.

They are, a through-hole forming step for perforating a through-hole in an electrical insulation substrate, a paste filling step for filling the through-hole with an electrically conductive paste, a thermally compressing step for bonding a wiring member disposed on one or both surfaces of the electrical insulation substrate by thermal compression, and a patterning step for etching the wiring member to form wiring traces.

This structure and the manufacturing method enable forming of the wiring traces having a high strength of bonding necessary for mounting electronic components by causing conductive particles in the electrically conductive paste to be placed into contact laterally at a high density for electrical connection with the wiring traces, and a resin in the electrically conductive paste penetrate into depressions in the asperate surface. They also enable forming of the fine wiring traces on either one or both surfaces of the wiring substrate by ensuring good electrical connections and bonding between the electrically conductive paste in the through-hole and the wiring traces by taking advantage of the plurality of granular bumps formed on the smooth surface, and also by finely roughening the surface, thereby providing the wiring substrate with the wiring traces of such a high density necessary for mounting the electronic components.

DETAILED DESCRIPTION OF PREFERRED EMBODIMENTS

Description is provided hereinafter of exemplary embodiments of the present invention with reference to the accompanying drawings.

First Exemplary Embodiment

Figure 1A:
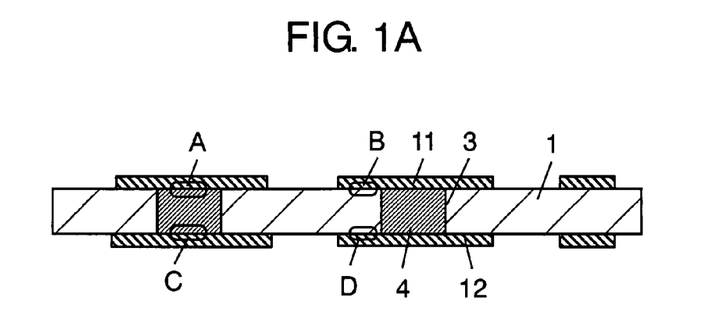
FIG. 1A is a cross sectional view showing a structure of a wiring substrate according to a first exemplary embodiment of the present invention.

FIG. 1A is a cross sectional view showing a structure of a double-sided wiring substrate according to the first exemplary embodiment of the present invention. Electrical insulation substrate 1 has through-holes 3 formed therein, and these through-holes 3 are filled with electrically conductive paste 4. Electrically conductive paste 4 electrically connects wiring traces 11 and 12 formed on both sides of through-holes 3.

Figure 1B:
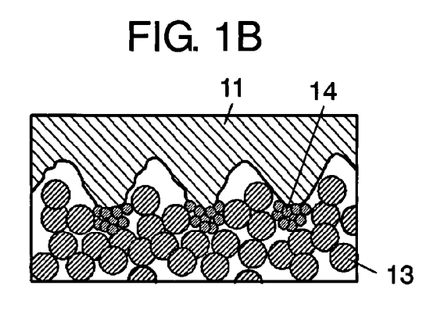
FIG. 1B is an enlarged sectional view showing a part of an interface marked "A" of the wiring substrate according to the first exemplary embodiment of the present invention.

First, FIG. 1B is an enlarged view depicting an interface portion marked "A" between wiring trace 11 and electrically conductive paste 4 shown in FIG. 1A.

As shown in FIG. 1B, wiring trace 11 is provided with an asperate surface having a mean curvilinear asperate interval Sm two times or longer in length greater than an average particle diameter of conductive particles 13 contained in electrically conductive paste 4, and a plurality of granular bumps 14 formed additionally on the asperate surface.

Here, the mean curvilinear asperate interval Sm is an index indicating a distance from a tip of one projection to a tip of the adjacent projection, an average value of which is calculated by measuring individual sums of distances from one projection to an adjacent depression present within a sampling length taken along a mean line of the curvilinear asperities.

Since the mean curvilinear asperate interval Sm is two times or longer in length greater than the average particle diameter of conductive particles 13, as described above, some conductive particles 13 in electrically conductive paste 4 can migrate into the depressions in the asperate surface, and those of conductive particles 13 that come in contact with the projections receive a force in the lateral direction and become contiguous to one another in a high density. In other words, electrical continuities are established between tip areas of the projections and conductive particles 13.

In addition, a resin present around conductive particles 13 in electrically conductive paste 4 moves toward inside of the depressions at the same time conductive particles 13 become contiguous to one another in the high density, and this can intensify the contiguity among the conductive particles. Besides, the resin moved inside the depressions serves as an adhesive layer at an interface between wiring trace 11 and the electrically conductive paste, and as a result, it improves the bonding of electrically conductive paste 4 with wiring trace 11.

Wiring trace 11 has granular bumps 14 formed on its surface. These bumps provide even a stronger anchorage effect when embedded into electrically conductive paste 4, so as to maintain the electrical continuity of wiring trace 11 with conductive particles 13 even if a pulling force acts on wiring trace 11.

It is desirable that these granular bumps 14 are formed into a mushroom-like shape concentrated around the tips of the projections such that a density of the granular bumps is greater at the tips than in the recesses between the projections, as shown in the figure, for the reason that the asperate surface ensures a good bonding and facilitates the high density contiguity among conductive particles 13 in the lateral direction. However, there are no restrictions in locations where the granular bumps are formed, besides the example shown in the figure, and they can be formed even in the vicinities of the depressions.

It is also desirable that the mean curvilinear asperate interval Sm has a length at least two times longer, but not more than ten times longer, than the average particle diameter of conductive particles 13 in respect of maintaining high contacting pressures in the lateral direction among the conductive particles and ensuring a sufficient thickness of the resin layer at the interface with wiring trace 11, even when the through-holes are reduced to 100 μm or less in diameter.

Figure 1C:
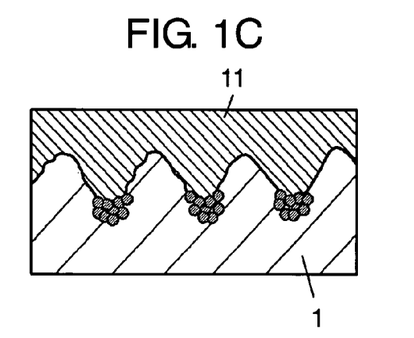
FIG. 1C is an enlarged sectional view showing a part of an interface marked "B" in the first exemplary embodiment of the present invention.

FIG. 1C, on the other hand, is an enlarged view depicting an interface portion marked "B" between wiring trace 11 and electrical insulation substrate 1 shown in FIG. 1A.

As shown in FIG. 1C, the asperate surface having the mean curvilinear asperate interval Sm two times or longer in length greater than the mean particle diameter of conductive particles 13 ensures a large contact area at the interface between wiring trace 11 and electrical insulation substrate 1. In addition, granular bumps 14 embedded in electrical insulation substrate 1 provide the anchorage effect to achieve strong bonding of the wiring traces.

Figure 1D:
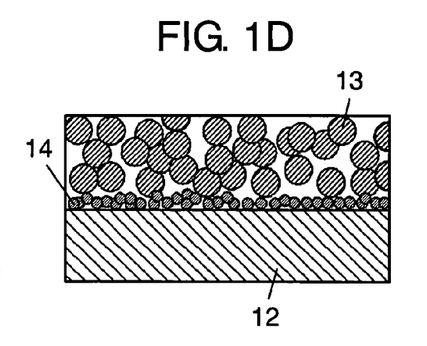
FIG. 1D is an enlarged sectional view showing a part of an interface marked "C" in the first exemplary embodiment of the present invention.

Shown next in FIG. 1D is an enlarged view of an interface portion marked "C" between wiring trace 12 and electrically conductive paste 4 shown in FIG. 1A.

This side of wiring trace 12 has generally a smooth surface, on which a plurality of granular bumps 14 are formed, as shown in FIG. 1D. Here, the generally smooth surface of wiring trace 12 is specifically defined such that a mean ten-point height Rz of the surface is 2.5 microns or less.

Conductive particles 13 contained in electrically conductive paste 4 are in contact generally uniformly with granular bumps 14 provided on the surface of wiring trace 12 to ensure an electrical continuity between them. Since this interfacing structure obtains its strength of bonding only by the anchorage effect of the granular bumps, the strength is not as large as that of wiring 11.

Granular bumps 14 formed on this generally smooth surface are such that the individual granular bumps are disposed independently from the adjacent ones in order to strengthen the anchorage effect. That is, the granular bumps are disposed in a manner that there are spaces among the ones next to each other near their bottom side. These spaces allow the resin in the electrically conductive paste to permeate through the granular bumps and spread over the smooth surface so as to increase the strength of bonding and prevent a crack from progressing at the interface between the granular bumps and the electrically conductive paste in the reliability testing. As a result, it improves the bonding and ensures the reliability of electrical continuity between the electrically conductive paste and the wiring trace.

Figure 1E:
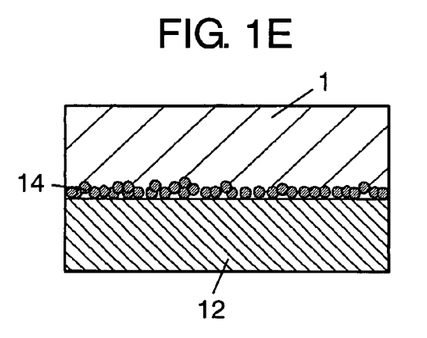
FIG. 1E is an enlarged sectional view showing a part of an interface marked "D" in the first exemplary embodiment of the present invention.

FIG. 1E depicts an enlarged view of an interface portion marked "D" between wiring trace 12 and electrical insulation substrate 1 shown in FIG. 1A.

As shown in FIG. 1E, fine granular bumps are formed over the interface between electrical insulation substrate 1 and wiring trace 12, and they are embedded into electrical insulation substrate 1. Since a thickness of the wiring trace is uniform and the granular bumps are formed uniformly on its surface, it is not likely that an etching time needs to be varied throughout the surface when etching is made to form the wiring trace.

This enables an over-etching time to be set to the minimum so as to reduce excessive thinning of the wiring trace attributable to the over-etching, and to control a width of the wiring trace highly accurately. Accordingly, fine wiring traces can be formed by the etching process.

Figure 4A:
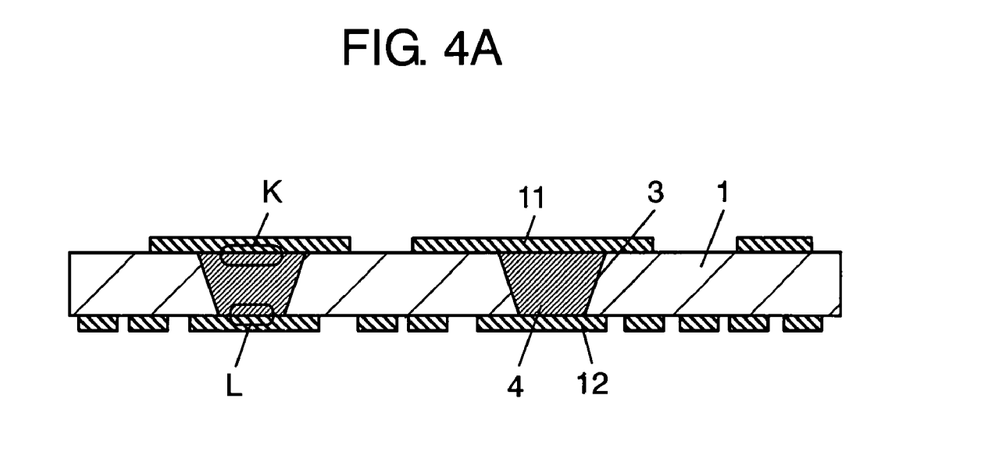
FIG. 4A is a cross sectional view showing a structure of another wiring substrate according to the first exemplary embodiment of the present invention.
Figure 4B:
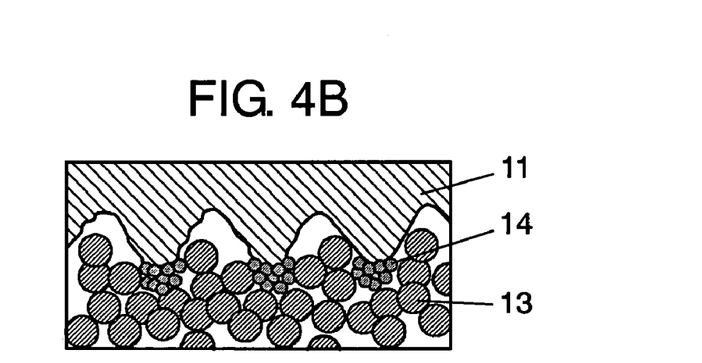
FIG. 4B is an enlarged sectional view showing a part of the interface marked "K" of the wiring substrate according to the first exemplary embodiment of the present invention.
Figure 4C:
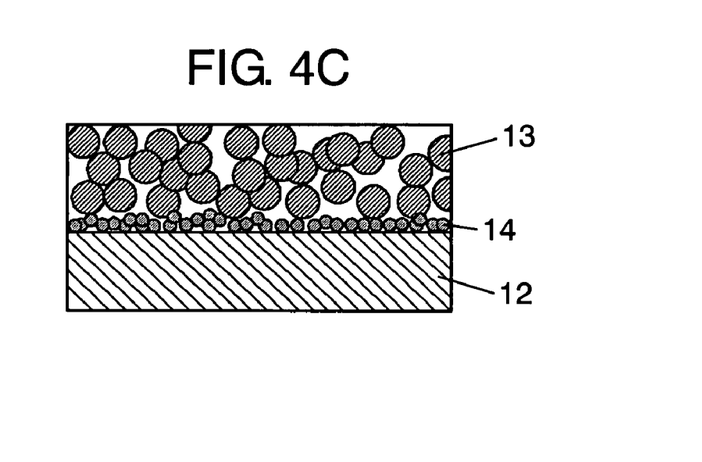
FIG. 4C is an enlarged sectional view showing a part of an interface marked "L" in the first exemplary embodiment of the present invention.

Alternatively, through-holes 3 may be so formed that they have different opening diameters at both sides by tapering their walls, as shown in FIG. 4A. FIG. 4B and FIG. 4C show enlarged sectional views of the interface portions "K" and "L" shown in FIG. 4A.

Since the reduction in diameter of the through-holes at the side where the fine wiring traces are formed can reduce surface areas of the wiring traces covering the through-holes, this structure helps to provide the wiring traces even more densely in combination with the above effect of forming the fine wiring traces.

In addition, since this structure can also provide large areas of the through-holes in contact with wiring traces at the side where the wiring traces are sparse, it does not impair their electrical continuities needlessly.

In the double-sided wiring substrate discussed above, it is desirable that the wiring traces have different thicknesses between the front layer and the backside layer, so that even finer wiring traces can be formed by thinning the layer where finer wiring is necessary for bare-chip mounting and the like, and a strength of bonding of the wiring traces can be protected from being impaired due to solder-scavenging by thickening them in the surface layer where soldering is required for mounting ball grid arrays, electronic components and the like.

As described above, the wiring substrate according to the present invention is suitable for such applications that require fine wiring traces for mounting semiconductor devices such as semiconductor interposers on one surface, and connecting pads of superior bonding for ball grid arrays used for connection with a mother board on the other surface.

Second Exemplary Embodiment

Description is provided next of a multilayer wiring substrate according to the second exemplary embodiment of the present invention. Here, description will be given only briefly of such components that have been discussed in connection with the previous exemplary embodiment.

Figure 2A:
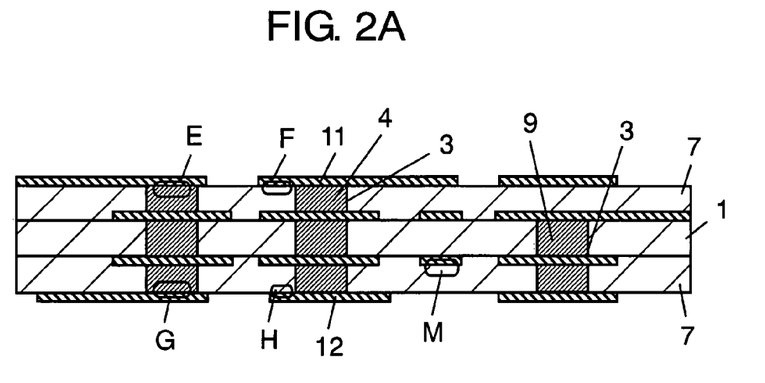
FIG. 2A is a cross sectional view showing a structure of a wiring substrate according to a second exemplary embodiment of the present invention.

FIG. 2A is a cross sectional view showing a structure of a multilayer wiring substrate according to the second exemplary embodiment of the present invention. The multilayer wiring substrate has through-holes 3 formed in electrical insulation substrates 1 and 7 and filled with electrically conductive pastes 4 and 9. This multilayer wiring substrate can accommodate wiring traces at a high density since through-holes 3 provide electrical connections across any layers at any desired locations.

Figure 2B:
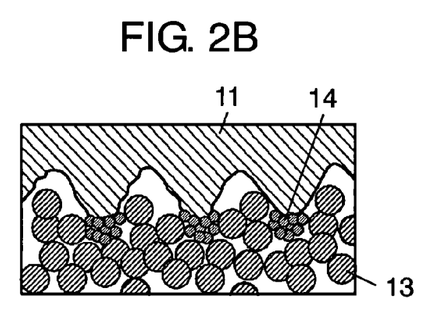
FIG. 2B is an enlarged sectional view showing a part of an interface marked "E" of the wiring substrate according to the second exemplary embodiment of the present invention.

FIG. 2B is an enlarged view depicting an interface portion marked "E" between wiring trace 11 and electrically conductive paste 4 shown in FIG. 2A. Furthermore, FIG. 2C is an enlarged view depicting another interface portion marked "F" between wiring trace 11 and electrical insulation substrate 7.

Figure 2C:
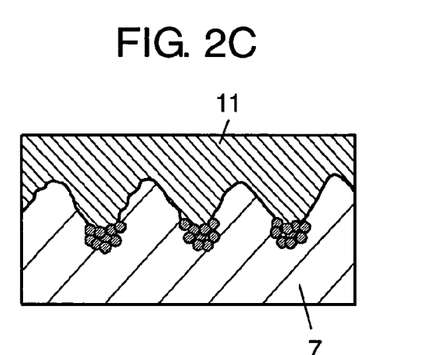
FIG. 2C is an enlarged sectional view showing a part of an interface marked "F" in the second exemplary embodiment of the present invention.

Both wiring traces 11 shown in FIG. 2B and FIG. 2C are provided with an asperate surface on one side thereof, the asperate surface having a mean curvilinear asperate interval Sm two times or longer in length greater than an average particle diameter of conductive particles 13 contained in electrically conductive paste 4, and a plurality of granular bumps 14 formed additionally on the asperate surface, in the like manner as discussed previously with reference to FIG. 1B and FIG. 1C. This configuration achieves both electrical connections and strong bonding of wiring traces 11 with electrically conductive paste 4, in the same way as detailed in the first exemplary embodiment.

Figure 2D:
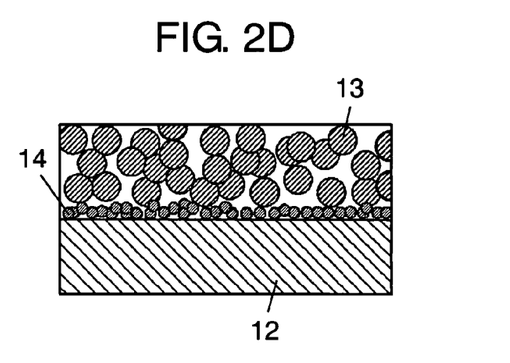
FIG. 2D is an enlarged sectional view showing a part of an interface marked "G" in the second exemplary embodiment of the present invention.

Shown next in FIG. 2D is an enlarged view of another interface portion marked "G" between wiring trace 12 and electrically conductive paste 4 shown in FIG. 2A. Also shown in FIG. 2E is an enlarged view of another interface portion marked "H" between wiring trace 12 and electrical insulation substrate 7.

Figure 2E:
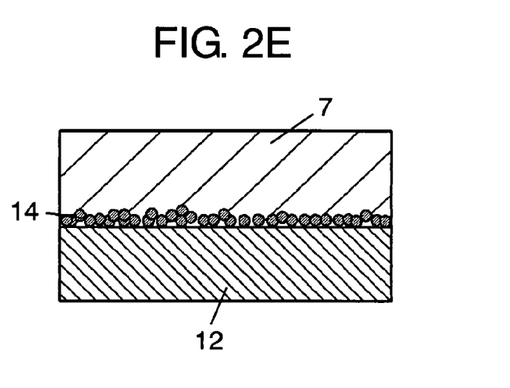
FIG. 2E is an enlarged sectional view showing yet a part of an interface marked "H" in the second exemplary embodiment of the present invention.

As shown in FIG. 2D and FIG. 2E, wiring trace 12 has generally a smooth surface, on which a plurality of granular bumps 14 are formed. The generally smooth surface of wiring trace 12 is defined specifically such that a mean ten-point height Rz of the surface is 2.5 microns or less, like that described in the previous exemplary embodiment.

Since a thickness of the wiring trace is uniform and the granular bumps are formed uniformly on its surface, as shown in these figures, it is not likely that an etching time needs to be varied throughout the surface when forming the wiring trace by etching, which enables formation of the wiring trace finely, as in the case discussed in the first exemplary embodiment.

The multilayer wiring substrate described above is suitable for applications that require fine wiring traces for mounting semiconductor devices such as semiconductor interposers on one surface, and connecting pads of superior bonding for ball grid arrays used for connection with a mother board on the other surface, since it is provided with fine wiring traces on its one surface and wiring traces of superior bonding on the other surface.

What has been described in the second exemplary embodiment is an example, in which the wiring traces of superior bonding are provided on the front surface layer for such an application that the component mounting surface is subject to a mechanical stress. However, the design of the multilayer wiring substrate is not limited to this surface configuration of the wiring traces. Depending on a density of wiring traces of an inner layer of the multilayer wiring substrate, for instance, there can be a stress developed in the effect of separating the wiring traces due to a rapid expansion of moisture inside the multilayer wiring substrate during the reflow mounting by soldering.

It is therefore possible to effectively increase the density of wiring traces of inner layers of the multilayer wiring substrate, by providing the wiring traces of superior bonding on layers where a large stress of separation is developed on the wiring traces, as well as the wiring traces suitable for fine wiring on other layers where dehydration is feasible to alleviate the stress of separation.

Figure 3A:
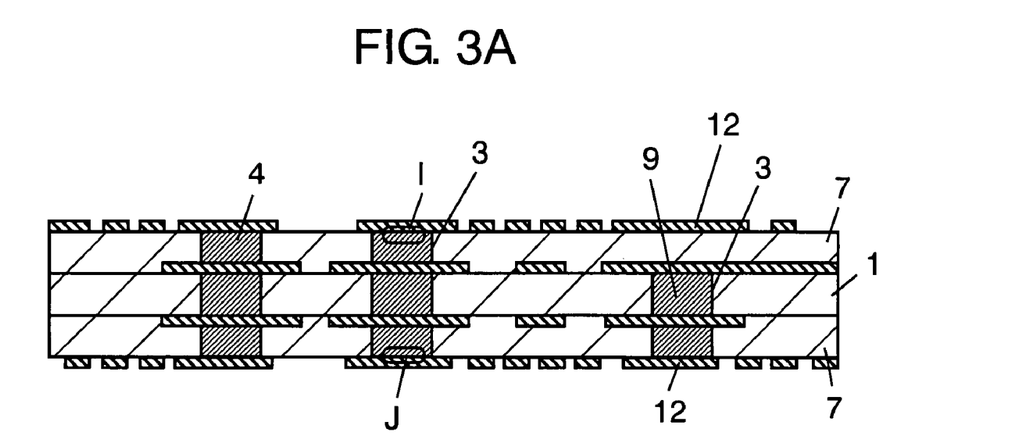
FIG. 3A is a cross sectional view showing a structure of another wiring substrate according to the second exemplary embodiment of the present invention.
Figure 3B:
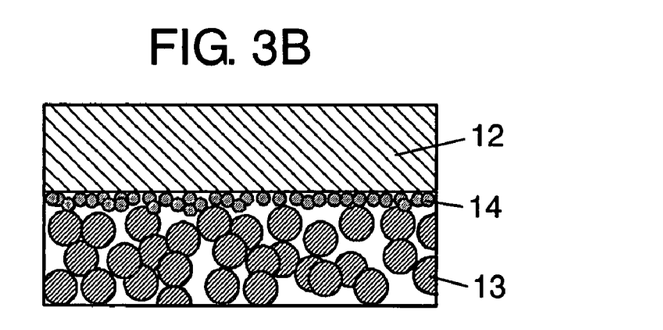
FIG. 3B is an enlarged sectional view showing a part of an interface marked "I" of the wiring substrate according to the second exemplary embodiment of the present invention.
Figure 3C:
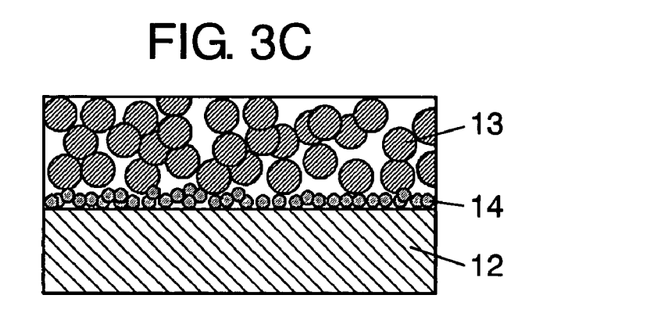
FIG. 3C is an enlarged sectional view showing a part of an interface marked "J" in the second exemplary embodiment of the present invention.

It is also appropriate to make such a wiring configuration as a multilayer wiring substrate shown in FIGS. 3A-3C. FIG. 3A shows a sectional view of the wiring substrate, and FIG. 3B and FIG. 3C show enlarged sectional views of interface portions "I" and "J" of FIG. 3A respectively. Wiring traces having a plurality of granular bumps 14 formed on generally smooth surfaces may be disposed on surface layers of the wiring substrate, as shown in these figures, if only fine wiring traces are required rather than the wiring traces of a substantially strong bonding for the surface layers on both sides of the multilayer wiring substrate. The fine wiring traces formed in this manner on both sides of the wiring substrate can hence increase the mounting density when used as a multi-chip module substrate and the like.

In this exemplary embodiment, description provided above is an example, in which the wiring traces are formed at a high density by reducing opening diameter of the through-holes and surface areas of the wiring traces covering the through-holes only at the side where the fine wiring traces are formed. However, similar advantages can also be achieved in the case of a multilayer wiring substrate by using tapered through-holes having different opening diameters between both sides thereof. Moreover, a multilayer wiring substrate of even a higher density can be achieved by forming the plurality of granular bumps 14 on generally smooth surfaces of the wiring traces that face the smaller diameter side of the through-holes throughout all layers of the multilayer wiring substrate.

In the double-sided wiring substrate of the first exemplary embodiment, description is provided of the example, in which thickness of the wiring traces are reduced on one side where they are formed finely, whereas thickness of the wiring traces are increased on the other side where solder mounting pads are formed. The same advantages as described there can also be realized by employing the like configuration in the surface layers of this multilayer wiring substrate.

In the case of the multilayer wiring substrate, even a higher density can be achieved by changing the thickness of the wiring traces of not only the outer layers but also of the inner layers.

Third Exemplary Embodiment

Description is provided next of the steps of manufacturing a double-sided wiring substrate according to the present invention by referring to FIGS. 5A to 5F. Here, description will be given only briefly of any items which have been discussed in connection with the example of the conventional art.

Figure 5A:
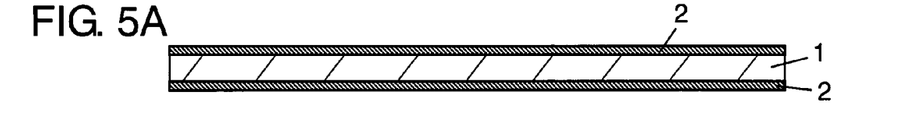
FIG. 5A is a cross sectional view of a wiring substrate illustrating one step of a manufacturing method thereof according to a third exemplary embodiment of the present invention.

First, electrical insulation substrate 1 has protective films 2 disposed on both front and back surfaces thereof, as shown in FIG. 5A.

Here, electrical insulation substrate 1 may be made of a composite base material comprised of a fiber and an impregnant of a resin. Examples of materials usable as the fiber include woven and unwoven cloths of glass fiber, aramid fiber, and Teflon fiber (a registered trademark of Du Pont de Nemours). The resin impregnant may be epoxy resin, PPE resin, PPO resin, phenolic resin, and the like. It is desirable, among the above materials, that the base material has a characteristic of compressibility in view of electrical connection through an electrically conductive paste inside through-holes, which will be described later. That is, the material has a property to shrink in thickness when it is hardened by thermocompression. Specifically, it is more desirable to use a porous base material made of aramid fiber impregnated with an epoxy resin in a manner to contain pores in it.

Besides the above, a material suitable for electrical insulation substrate 1 is the one used for a flexible wiring substrate having a three-layer structure consisting of a film backed by adhesive layers on both surfaces thereof. Specific examples of the suitable base material are a thermosetting plastic film of epoxy resin, a thermoplastic film of fluorine resin, polyimide resin, liquid crystalline polymer and the like, backed by adhesive layers on both surfaces thereof.

A simple and highly productive manufacturing method is to place films consisting of a principal ingredient of PET or PEN, as protective films 2, on both surfaces of electrical insulation substrate 1 by a process of lamination.

Figure 5B:
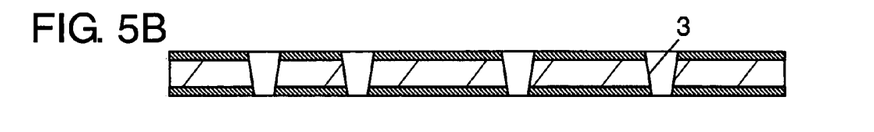
FIG. 5B is a cross sectional view of the wiring substrate illustrating another step of the manufacturing method according to the third exemplary embodiment of the present invention.

The next process is to form through-holes 3 that penetrate through all of electrical insulation substrate 1 and protective films 2, as shown in FIG. 5B. Although through-holes 3 can be formed by any method such as punching, drilling and laser machining, a superior productivity can be achieved by a process using $CO_2$ gas laser or YAG laser, which is also capable of forming the through-holes of small diameters in a short time. It is desirable to form these through-holes into a configuration of tapered wall with different opening diameters at both sides thereof in order to make the wiring substrate of a higher density. The through-holes of such configuration can be realized by adjusting conditions of irradiating pulse and a focusing point so as to reduce the penetrating side aperture in the laser machining process.

Figure 5C:
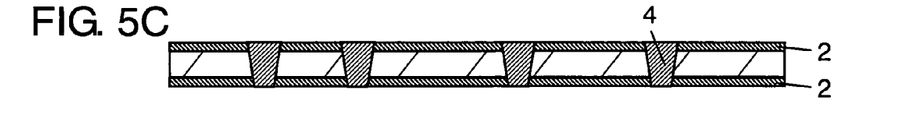
FIG. 5C is a cross sectional view of the wiring substrate illustrating another step of the manufacturing method according to the third exemplary embodiment of the present invention.

Next, through-holes 3 are filled with electrically conductive paste 4, as shown in FIG. 5C. Electrically conductive paste 4 is comprised of conductive particles of any metal such as copper, silver, gold and the like or an alloy of any of these metals in combination with a component of resin material. Particle diameters of the conductive particles are adjusted according to a diameter of the through-holes, and that conductive particles having a mean diameter ranging 1 to 5 µm can be used for through-holes of a diameter between 50 and 200 µm, for instance. It is desirable that the conductive particles are so pre-selected as to be uniform in their diameters in consideration of stabilizing electrical continuities.

Protective films 2 play the role of preventing electrically conductive paste 4 from sticking to the surface of the electrical insulation substrate while also ensuring a filling amount of the electrically conductive paste. The electrically conductive paste has an advantage of achieving superior productivity since it can be filled by printing.

Figure 5D:
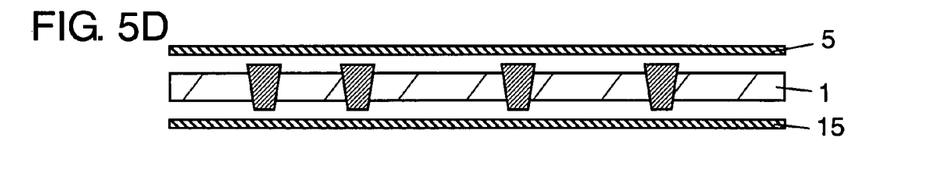
FIG. 5D is a cross sectional view of the wiring substrate illustrating another step of the manufacturing method according to the third exemplary embodiment of the present invention.

Protective films 2 are then removed, and wiring members 5 and 15 are laid on both surfaces of the electrical insulation substrate, as shown in FIG. 5D. Protective films 2 ensure a proper filling amount of electrically conductive paste 4. In other words, electrically conductive paste 4 projects above the surfaces of electrical insulation substrate 1 only by a height equivalent to the thickness of protective films 2.

The surface of wiring member 5 that comes into contact with electrical insulation substrate 1 is provided with asperities having a mean curvilinear asperate interval Sm two times or longer in length greater than an average particle diameter of the conductive particles contained in the electrically conductive paste, and a plurality of granular bumps 14 are additionally formed on the asperate surface.

In other words, a method of manufacturing wiring member 5 comprises a step of determining an average particle diameter of the conductive particles used in the electrically conductive paste by measuring a distribution of their particle sizes, a step of selecting a metallic foil having a mean curvilinear asperate interval Sm of two times or longer in length greater than the average particle diameter based on the result of above measurement, and a step of forming a plurality of granular bumps.

On the other hand, the surface of wiring member 15 that comes into contact with electrical insulation substrate 1 has generally a smooth surface provided additionally with a plurality of granular bumps 14 formed thereon. When through-holes 3 are made into a tapered form having different opening diameters between two sides, it is desirable in view of improving the density of wiring traces that wiring member 15 is disposed in a manner so that the generally smooth surface provided with the plurality of granular bumps 14 confronts the side where the through-holes are opened in the smaller diameter, as in the case previously discussed in the first exemplary embodiment.

Copper foils are used generally as wiring members, and an electrodeposited copper foil having a lustered surface on one side is used for the wiring member in the outermost layer. A condition of the asperities formed on the surface of the electrodeposited copper foil can be controlled easily by adjusting a plating condition and an amount of additive, and the granular bumps can be formed by setting an electric current of the electrolytic plating to a high density.

Figure 5E:
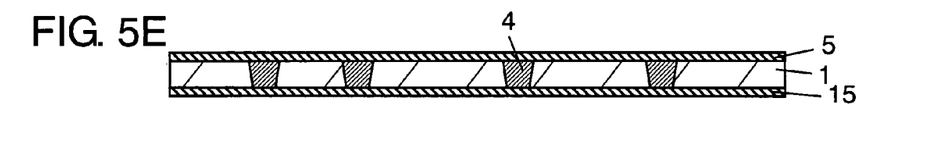
FIG. 5E is a cross sectional view of the wiring substrate illustrating still another step of the manufacturing method according to the third exemplary embodiment of the present invention.

Wiring members 5 and 15 are then subjected to thermo-compression in the step shown in FIG. 5E for bonding to both surfaces of electrical insulation substrate 1. This process also thermo-sets electrically conductive paste 4, and makes electrical connections between the wiring members on the both surfaces through electrically conductive paste 4.

Since the mean curvilinear asperate interval Sm in the surface wiring member 5 is two times or longer in length greater than the average particle diameter of the conductive particles in electrically conductive paste 4, some of the conductive particles can migrate into depressions in the asperate surface, and those of the conductive particles coming in contact with projections receive a force in the lateral direction and become contiguous to one another in a high density. In other words, electrical continuities are established between tip areas of the projections and the conductive particles.

In addition, the resin present around the conductive particles in the electrically conductive paste moves toward the inside of the depressions at the same time when the conductive particles become contiguous to one another in the high density, and this can further enhance the contiguities among the conductive particles.

Besides, the resin moved inside the depressions serves as an adhesive layer at an interface between wiring member 5 and the electrically conductive paste 4, and as a result, it improves the bonding of electrically conductive paste 4 with wiring member 5.

Granular bumps 14 formed on the surface of wiring member 5 provide even a stronger anchorage effect when they are embedded into electrically conductive paste 4, so as to maintain the electrical continuity with the conductive particles even if a pulling force of separation acts on wiring member 5.

Figure 6:
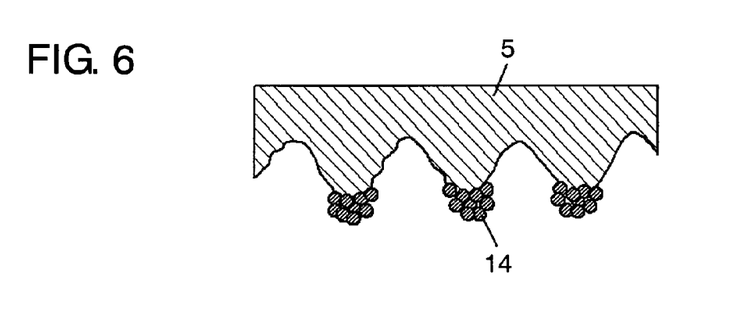
FIG. 6 is an enlarged sectional view showing a surface of a wiring member used for the wiring substrate of the present invention.

It is desirable that these granular bumps 14 are formed into a mushroom-like shape concentrated around the tip portions of the projections, as shown in FIG. 6, for the reasons that the asperate surface ensures a good bonding and facilitates the high density contiguities among conductive particles 13 in the lateral direction. However, there are no restrictions for locations where the granular bumps are formed besides the example shown in the figure, and they can be formed even in the vicinities of the depressions.

It is also desirable that the mean curvilinear asperate interval Sm in the surface of wiring member 5 has a length two times or longer but no more than ten times the average particle diameter of the conductive particles in respect of maintaining high contacting pressures in the lateral direction among the conductive particles and ensuring a sufficient thickness of the resin layer at the interface with wiring traces 11, even when through-holes 3 are reduced to 100 µm or less in diameter.

On the other hand, wiring member 15 has generally a smooth surface, on which a plurality of granular bumps 14 are formed. The conductive particles contained in electrically conductive paste 4 are in contact generally uniformly with granular bumps 14 provided on the surface of wiring member 15 to ensure the electrical continuity between them as well as their bonding by the anchorage effect of granular bumps 14. Like the previous exemplary embodiment, the generally smooth surface of wiring member 15 is specifically defined such that a mean ten-point height Rz of the surface is 2.5 microns or less.

Here, granular bumps 14 formed on this generally smooth surface are such that the individual granular bumps are disposed independently from the adjacent ones in order to further strengthen the anchorage effect. That is, the granular bumps are disposed in such a manner that there are spaces among the adjacent ones near their bottom side. These spaces allow the resin in the electrically conductive paste to permeate through the granular bumps and spread over the smooth surface so that it increases the strength of bonding and prevents any crack from progressing at the interface between the granular bumps and the electrically conductive paste in the reliability testing. As a result, it improves the bonding and ensures the reliability of electrical continuity between the electrically conductive paste and the wiring traces.

It is important to keep flatness of the surface to a low level when such granular bumps are formed independently by the electrolytic plating. In other words, asperities in the surface, if present, cause increased densities of electric current near the tip portions on the surface, which tend to create granular bumps of a continuous configuration on the surface. In an example embodied here, granular bumps of an independent configuration are formed on a copper foil having a surface flatness Ra of not larger than 4 µm.

In this exemplary embodiment, certain conditions have also been established for plating an overcoat on surfaces of granules after formation of the granular bumps to help adhere the bumps more strongly, but to an extent not to impair their independent configuration.

Furthermore, it is desirable that the surfaces of wiring members 5 and 15 are covered with films formed of a metal, a metal oxide or a metal alloy using any of Cr, Zn, Ni, Co and Sn, in view of improving bonding of them with the resin. However, the surface treatment layers of this kind degrade electrical continuities of the wiring members with electrically conductive paste 4, if formed excessively, since they have the property of electrical insulation, and they thereby impair the reliability of via-hole connections in the multilayer wiring substrate. It is therefore preferable that the surface treatment layers are formed into an extremely small thickness not exceeding 50 nm, which is so thin that they expose the base material (e.g., copper, if the wiring member is made of a copper foil) of the wiring members in places through the treated layers.

A pattern of the wiring traces is then formed by an exposure to light and development after a photosensitive resist is formed on the entire surfaces of wiring members 5 and 15. Any of a dry-film type and a liquid type may be usable for this resist. Here, the resist material may be screen-printed to form the pattern instead of using the photosensitive material when a finely sophisticated pattern is not required. Subsequently, wiring members 5 and 15 are etched and the photosensitive resist is removed to provide double-sided wiring substrate 6 of the configuration shown in FIG. 5F.

Figure 5F:
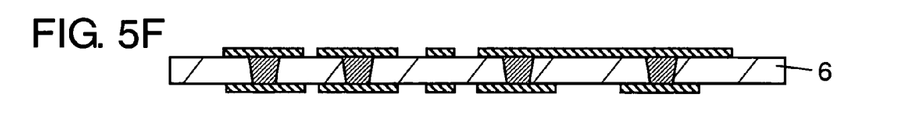
FIG. 5F is a cross sectional view of the wiring substrate illustrating yet another step of the manufacturing method according to the third exemplary embodiment of the present invention.

The surface of wiring member 15 in contact with electrical insulation substrate 1 has fine granular bumps formed thereon, and they are embedded into electrical insulation substrate 1. Since the wiring member has a uniform thickness and the granular bumps formed uniformly on the surface, it is not likely that an etching time needs to be varied throughout the surface when etching is made to form the wiring traces. This enables an over-etching time to be set to the minimum so as to reduce excessive thinning of the wiring trace attributable to the over-etching, and to control widths of the wiring traces highly accurately. Accordingly, fine wiring traces can be formed by the etching process.

It is more desirable that wiring members 5 and 15 are made of materials of different thicknesses when this wiring substrate is used as a substrate of semiconductor interposer. A material having a thickness not exceeding 10 µm enables formation of fine wiring traces of 25 µm or less in width, and it is therefore suitable for wiring member 15. On the other hand, a material having a thickness not less than 10 µm can avoid deterioration of the bonding strength in the interface due to scavenging by solder, and is therefore suitable for wiring member 15.

A metal foil of 10 µm or less in thickness may also be used as an alternative material of wiring member 15. Or, a thick foil of 10 µm or larger, because of the ease of handling, may be bonded to the electrical insulation substrate and then etched uniformly over the entire surface to thin it down. Like advantages can also be attained in this way.

It becomes possible to use such a thin wiring member, which can not otherwise be handled as it is due to its susceptive nature of being damaged, wrinkled and twisted, by thinning down the wiring member of the outermost layer in the manner as described above, thereby realizing even finer wiring traces. The above embodiment is not meant to limit thicknesses of the wiring members, but it is merely an example of showing the way of thinning the wiring members to easily form the fine wiring traces irrespective of their surface configurations.

As described, the manufacturing method of the present invention can provide a double-sided wiring substrate having fine wiring traces on one side and wiring traces of superior bonding strength on the other surface, and thereby suitable for a semiconductor interposer.

It is also feasible to manufacture a wiring substrate by using a copper-clad laminate comprising electrical insulation substrate 1 and one of wiring member 5 and wiring members 15 laminated in advance on at least one of the surfaces.

The invention can provide a wiring substrate having wiring traces of strong bonding necessary for mounting electronic components when using a copper-clad laminate bearing a lamination of wiring member 5, and a wiring substrate having wiring traces of a high density required for mounting electronic components when using a copper-clad laminate bearing a lamination of wiring member 15.

In other words, the invention enables manufacturing of the wiring substrate by using any type of copper-clad laminate having one or both of wiring member 5 and wiring member 15 according to specifications and properties required for the wiring substrate.

Fourth Exemplary Embodiment

Description is provided next of the steps of a manufacturing multilayer wiring substrate according to the present invention by referring to FIGS. 7A to 7I. Here, description will be given only briefly of any items, which have been discussed in connection with the third exemplary embodiment.

Figure 7A:
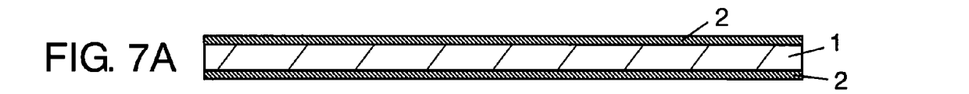
FIG. 7A is a cross sectional view of a wiring substrate illustrating one step of a manufacturing method thereof according to a fourth exemplary embodiment of the present invention.

First, electrical insulation substrate 1 has protective films 2 disposed on both front and back surfaces thereof, as shown in FIG. 7A.

Figure 7B:
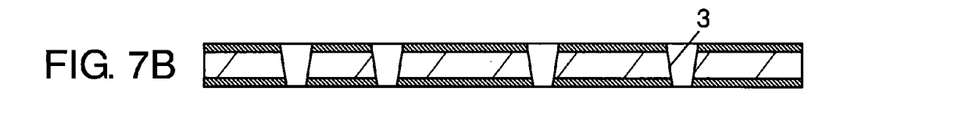
FIG. 7B is a cross sectional view of the wiring substrate illustrating another step of the manufacturing method according to the fourth exemplary embodiment of the present invention.

The next process is to form through-holes 3 that penetrate all of protective films 2 and electrical insulation substrate 1, as shown in FIG. 7B.

It is desirable that these through-holes are formed into a configuration with tapered walls with different opening diameters at both sides thereof in order to make the wiring substrate of a higher density. In addition, the multilayer wiring substrate of even a higher density can be achieved by forming a plurality of granular bumps 14 on generally smooth surfaces of wiring traces that face the smaller diameter side of through-holes throughout all layers of the multilayer wiring substrate, as previously described in connection with the third exemplary embodiment. Although the through-holes shown in the figures have their inner walls tapered in one direction, this shall be considered as illustrative and not restrictive. Like advantages can be achieved even if tapering of the through-holes is not oriented in the same direction.

Figure 7C:
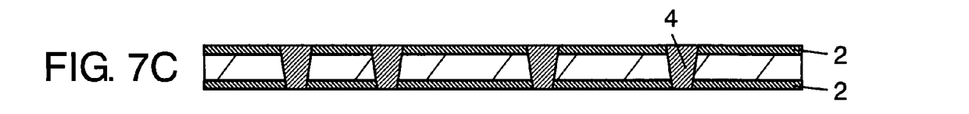
FIG. 7C is a cross sectional view of the wiring substrate illustrating another step of the manufacturing method according to the fourth exemplary embodiment of the present invention.
Figure 7D:
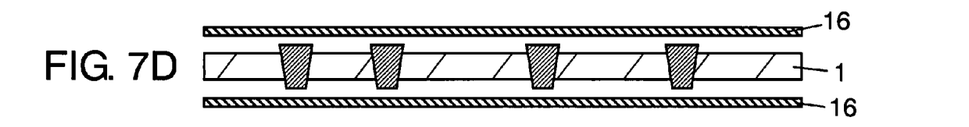
FIG. 7D is a cross sectional view of the wiring substrate illustrating another step of the manufacturing method according to the fourth exemplary embodiment of the present invention.

Next, through-holes 3 are filled with electrically conductive paste 4, as shown in FIG. 7C. Subsequently, protective films 2 are removed, and wiring members 16 are laid on both surfaces of the electrical insulation substrate, as shown in FIG. 7D.

Each of wiring members 16 used here is selected according to a surface that comes into contact with electrical insulation substrate 1, between one configuration provided with asperities having a mean curvilinear asperate interval Sm of two times or longer in length greater than an average particle diameter of conductive particles contained in the electrically conductive paste with a plurality of granular bumps 14 additionally formed on the asperate surface, and another configuration provided with generally a smooth surface having a plurality of granular bumps 14 formed thereon like the one discussed in connection with the previous exemplary embodiment. The individual wiring members are thus independently and discretionary selected according to densities of the wiring traces and mechanical stresses imposed upon them.

While an enlarged view of the interface portion "M" of FIG. 2A is shown in FIG. 6, it is more desirable that an outer layer of wiring member 16 has a surface of the configuration provided with a plurality of granular bumps formed on generally smooth surface. A reduction in roughness of the surface where an etching resist is coated can ease the subsequent removal of the resist and avoid residue of the resist from being left on the surface. Since this can make wiring member 16 more uniform in thickness while decreasing patterning defects, it reduces an extent of variation in etching time necessary to form the fine wiring traces.

Figure 7E:
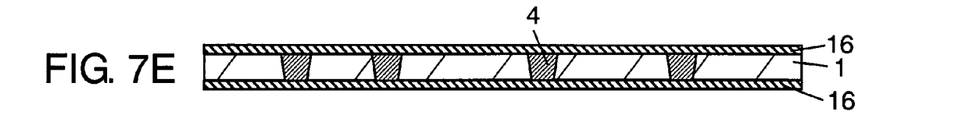
FIG. 7E is a cross sectional view of the wiring substrate illustrating another step of the manufacturing method according to the fourth exemplary embodiment of the present invention.
Figure 7F:
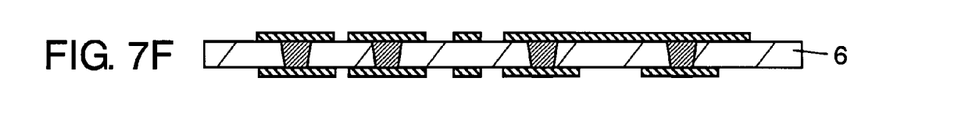
FIG. 7F is a cross sectional view of the wiring substrate illustrating another step of the manufacturing method according to the fourth exemplary embodiment of the present invention.

Wiring members 16 are then bonded to both surfaces of electrical insulation substrate 1, as shown in FIG. 7E, by subjecting them to thermo-compression.

This process also thermo-sets electrically conductive paste 4, and makes electrical connections between wiring members 16 on the both surfaces through electrically conductive paste 4. Subsequently, wiring members 16 are etched for patterning to provide double-sided wiring substrate 6 of the configuration shown in FIG. 7F.

Figure 7G:
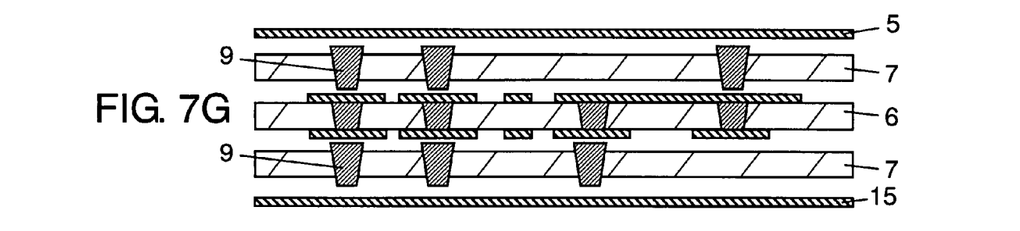
FIG. 7G is a cross sectional view of the wiring substrate illustrating another step of the manufacturing method according to the fourth exemplary embodiment of the present invention.

In the next step, electrical insulation substrates 7 filled with electrically conductive paste, as prepared in the like manner as in the steps of FIG. 7A to FIG. 7D, and wiring members 5 and 15 are laminated as shown in FIG. 7G.

Here, the surface of wiring member 5 that comes into contact with electrical insulation substrate 7 is provided with asperities having a mean curvilinear asperate interval Sm two times or longer in length greater than the average particle diameter of the conductive particles contained in the electrically conductive paste, and a plurality of granular bumps 14 formed further on the asperate surface, and the surface of wiring member 15 that with another electrical insulation substrate 7 has generally a smooth surface provided additionally with a plurality of granular bumps 14 formed thereon. These configurations are similar to the example illustrated in the third exemplary embodiment, and they are selected according to densities of the wiring traces and mechanical stresses imposed upon them.

Figure 7H:
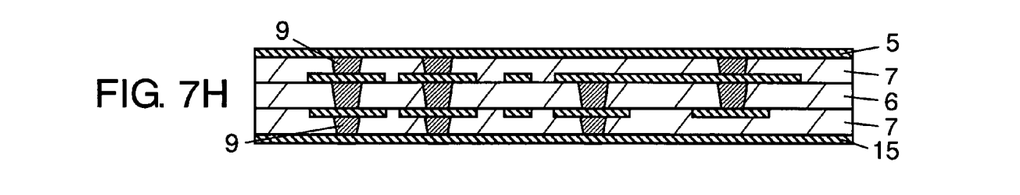
FIG. 7H is a cross sectional view of the wiring substrate illustrating still another step of the manufacturing method according to the fourth exemplary embodiment of the present invention.

Next, wiring members 5 and 15 are subjected to thermo-compression to bond them to electrical insulation substrates 7 in the step shown in FIG. 7H. At the same time, this process also bonds electrical insulation substrates 7 to double-sided wiring substrate 6. This step of thermo-compression also thermo-sets electrically conductive paste 9, in the same manner as the step shown in FIG. 7E, to make highly dense contacts among wiring members 5 and 15 and the wiring traces on the double-sided wiring substrate, and accomplish electrical continuities among them. The subsequent etching for patterning wiring members 5 and 15 complete the multi-layer wiring substrate shown in FIG. 7I.

Figure 7I:
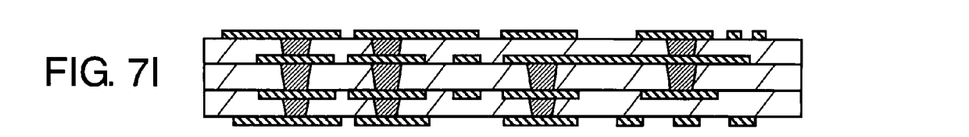
FIG. 7I is a cross sectional view of the wiring substrate illustrating yet another step of the manufacturing method according to the fourth exemplary embodiment of the present invention.

A metal foil thinner than that of wiring member 5 may be used as a material of wiring member 15 in order to fine down wiring traces, in the same manner as described in the third exemplary embodiment. Or, a thick metal foil may be used for ease of handling, which can be thinned down by etching it uniformly after bonding it into lamination with the electrical insulation substrate. In the case of the multilayer wiring substrate, even a higher density can be achieved by not only selecting configurations of the wiring traces but also changing thicknesses of them according to the mechanical stresses imposed on these wiring traces of the outer layers and the inner layers.

As described, the manufacturing method of the present invention is to form a plurality of different kinds of wiring traces having various surface configurations within the multilayer wiring substrate while maintaining their electrical continuities with the electrically conductive paste via the through-holes. That is, there are fine wiring traces formed in the layers, which are not likely to receive any mechanical stress, and other wiring traces of superior bonding strength in the layers, which are likely to receive mechanical stress, thereby providing the wiring substrate of high wiring density while also ensuring the strength of bonding of the wiring traces necessary for mounting electronic components.

This invention also enable formation of fine wiring traces on both surfaces of the multilayer wiring substrate to provide even a higher density by arranging wiring traces provided with the plurality of granular bumps 14 formed on generally smooth surfaces similar to wiring traces 11 in place of wiring traces 12, when the wiring substrate is used for bare-chip mounting.

Although what has been illustrated above is a four-layered substrate as an example of the multilayer wiring substrate, the number of layers shall not be considered as being limited only to four of this embodiment. The layers can be further increased by repeating steps similar to those discussed above.

It is also feasible to manufacture a wiring substrate by using multiple layers of copper-clad laminates, each comprising electrical insulation substrate 1, and one of wiring member 5 and wiring members 15 laminated in advance on at least one of the surfaces.

The invention can provide a wiring substrate having wiring traces of strong bonding necessary for mounting electronic components when using layers of copper-clad laminates bearing laminations of wiring members 5, and a wiring substrate having wiring traces of high density required for mounting electronic components when using layers of copper-clad laminates bearing laminations of wiring members 15.

In other words, the invention enables manufacturing of the wiring substrate by using a number of copper-clad laminates of any type, each having one or both of wiring member 5 and wiring member 15 according to the specifications and properties required for the wiring substrate.

As described above, the present invention provides methods enabling formation of wiring traces of a strength of bonding necessary for mounting electronic components as well as finer wiring traces on one or both surfaces of the wiring substrate by making fine asperities on the surfaces. The wiring substrate is useful for mounting electronic components with high reliability and high density, and adaptable for applications to electronic apparatuses of many kinds.

The invention claimed is:
1. A wiring substrate comprising:
an electrical insulation substrate;
a through-hole formed in the electrical insulation substrate;

an electrically conductive paste filled inside the through-hole, the electrically conductive paste having conductive particles; and wiring traces disposed on one or both surfaces of the electrical insulation substrate and electrically connected with the electrically conductive paste;

wherein interfaces of the wiring traces in contact with the electrically conductive paste have an asperate surface constituted by projections and recesses;

wherein the asperate surface has a mean curvilinear asperate interval at least two times longer, but no more than ten times longer, than an average particle diameter of the conductive particles contained in the electrically conductive paste; and wherein a plurality of granular bumps are formed on said asperate surface such that a density of said granular bumps is greater at tips of the projections of the asperate surface than in the recesses of the asperate surface.

2. The wiring substrate in claim 1, wherein the wiring traces are disposed on both surfaces of the electrical insulation substrate, and the wiring traces on the two surfaces are different in thickness with respect to each other.

3. A wiring member used for the wiring substrate of claim 1.

4. A copper-clad laminate comprising an electrical insulation substrate having a through-hole filled with an electrically conductive paste, and the wiring member of claim 3 laminated therewith.

5. A wiring substrate comprising:

an electrical insulation substrate;

a through-hole formed in the electrical insulation substrate;

an electrically conductive paste filled inside the through-hole, the electrically conductive paste having conductive particles; and wiring traces disposed on one or both surfaces of the electrical insulation substrate and electrically connected with the electrically conductive paste;

wherein interfaces of the wiring traces disposed on one of the surfaces and in contact with the electrically conductive paste have an asperate surface constituted by projections and recesses;

wherein the asperate surface has a mean curvilinear asperate interval at least two times longer, but no more than ten times longer, than an average particle diameter of the conductive particles contained in the electrically conductive paste;

wherein a plurality of granular bumps are formed on said asperate surface such that a density of said granular bumps is greater at tips of the projections of the asperate surface than in the recesses of the asperate surface; and wherein interfaces of the wiring traces disposed on the other surface and in contact with the electrically conductive paste have a smooth surface with a plurality of granular bumps formed thereon;

wherein the plurality of granular bumps on the smooth surface are formed on an entire area of the smooth surface such that a mean ten-point height of the smooth surface is 2.5 microns or less; and wherein a resin in the electrically conductive paste is present around the granular bumps such that the electrically conductive paste permeates through the granular bumps and spreads over the smooth surface.

6. The wiring substrate of claim 5, wherein the electrical insulation substrate comprises a plurality of layers, the wiring traces disposed on the individual layers of the electrical insulation substrate are connected to one another with the electrically conductive paste, and the interfaces have at least one of the asperate surface and the smooth surface.

7. The wiring substrate of claim 6, wherein the interfaces of the wiring traces formed on one of outermost surfaces have the asperate surface, and the interfaces of the wiring traces formed on the other of the outermost surfaces have the smooth surface.

8. The wiring substrate of claim 6, wherein the interfaces of the wiring traces formed on outermost surfaces have the smooth surface.

9. The wiring substrate of claim 6, wherein the through-hole provided in at least one of the layers of the electrical insulation substrate comprises a tapered hole having a different opening diameter at each side, the asperate surface is positioned at one side facing a larger diameter of the tapered hole, and the smooth surface is positioned at the other side facing a smaller diameter of the tapered hole.

10. The wiring substrate of claim 6, wherein the interfaces of the wiring traces formed on at least one of the layers located at an interior side of the electrical insulation substrate have the smooth surface.

11. The wiring substrate in claim 6, wherein the wiring traces have different thicknesses.

12. The wiring substrate of claim 6, wherein a thickness of the wiring traces formed on one of outermost surfaces is different from a thickness of the wiring traces formed on the other of the outermost surfaces.

13. The wiring substrate in claim 5, wherein the wiring traces have different thicknesses.

* * * * *